United States Patent
Xu et al.

(10) Patent No.: US 10,913,893 B2
(45) Date of Patent: Feb. 9, 2021

(54) ADDITIVE TO PHOSPHORIC ACID ETCHANT

(71) Applicant: YANGTZE MEMORY TECHNOLOGIES CO., LTD., Wuhan (CN)

(72) Inventors: Rong Xu, Wuhan (CN); Wenbin Sun, Wuhan (CN); Jie Su, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/210,569

(22) Filed: Dec. 5, 2018

(65) Prior Publication Data

US 2020/0148949 A1 May 14, 2020

Related U.S. Application Data

(63) Continuation of application No. PCT/CN2018/115124, filed on Nov. 13, 2018.

(51) Int. Cl.
| | |
|---|---|
| *H01L 21/00* | (2006.01) |
| *C09K 13/06* | (2006.01) |
| *C09K 15/04* | (2006.01) |
| *H01L 21/311* | (2006.01) |
| *H01L 27/11582* | (2017.01) |

(52) U.S. Cl.
CPC ............. *C09K 13/06* (2013.01); *C09K 15/04* (2013.01); *H01L 21/31111* (2013.01); *H01L 27/11582* (2013.01)

(58) Field of Classification Search
None
See application file for complete search history.

(56) References Cited

U.S. PATENT DOCUMENTS

| | | | |
|---|---|---|---|
| 5,429,673 A | 7/1995 | Peterson et al. | |
| 6,284,721 B1* | 9/2001 | Lee | .......................... C03C 15/00 134/2 |

FOREIGN PATENT DOCUMENTS

| | | |
|---|---|---|
| CN | 10472361 A | 2/2004 |
| CN | 101605869 A | 12/2009 |
| CN | 104576313 A | 4/2015 |
| CN | 105273718 A | 1/2016 |

(Continued)

OTHER PUBLICATIONS

"Hexamethyldisilazane"; MSDS No. 440191; Sigma-Aldrich, https://www.sigmaaldrich.com/catalog/product/aldrich/440191?lang=en&region=US (accessed Jun. 9, 2020). (Year: 2020).*

(Continued)

*Primary Examiner* — Reema Patel
(74) *Attorney, Agent, or Firm* — Bayes PLLC

(57) ABSTRACT

Embodiments of compositions of a wet etchant and additive thereto for selectively etching silicon nitride to silicon oxide are disclosed. In an example, a composition of an additive to a phosphoric acid etchant includes an inhibitor and a dispersant. The inhibitor is absorbable on a surface of silicon oxide and capable of inhibiting etching of the surface of silicon oxide by the phosphoric acid etchant. The dispersant is capable of reacting with a by-product of a reaction between the phosphoric acid etchant and at least one of silicon oxide and silicon nitride and reducing a viscosity of the phosphoric acid etchant.

20 Claims, 6 Drawing Sheets

(56) References Cited

FOREIGN PATENT DOCUMENTS

| | | | |
|---|---|---|---|
| CN | 107345137 A | 11/2017 | |
| CN | 107573940 A | 1/2018 | |
| CN | 108690621 A | 10/2018 | |
| CN | 109689838 A | 4/2019 | |
| KR | 20110037766 A | 4/2011 | |
| KR | 101097277 B1 | 12/2011 | |
| KR | 101335855 B1 | 12/2013 | |
| KR | 20140079267 A | 6/2014 | |
| KR | 20170130665 A | 11/2017 | |
| KR | 20170137309 A | 12/2017 | |
| KR | 20180122141 A | 11/2018 | |
| TW | 201604265 A | 2/2016 | |
| WO | 2018124705 A1 | 7/2018 | |
| WO | WO-2018124705 A1 * | 7/2018 | ............. C09K 13/06 |

OTHER PUBLICATIONS

Wikipedia Contributors. "Hexamethyldisilazane." Wikipedia, Wikimedia Foundation, published May 6, 2020, https://en.wikipedia.org/wiki/Bis(trimethylsilyl)amine (accessed Jun. 9, 2020) (Year: 2020).*

International Search Report issued in corresponding International Application No. PCT/CN2018/115124, dated Aug. 20, 2019, 4 pages.

Written Opinion of the International Searching Authority issued in corresponding International Application No. PCT/CN2018/115124, dated Aug. 20, 2019, 6 pages.

* cited by examiner

ADDITIVE TO PHOSPHORIC ACID ETCHANT

CROSS REFERENCE TO RELATED APPLICATION

This application is continuation of International Application No. PCT/CN2018/115124, filed on Nov. 13, 2018, entitled "ADDITIVE TO PHOSPHORIC ACID ETCHANT," which is hereby incorporated by reference in its entirety.

BACKGROUND

Embodiments of the present disclosure relate to compositions of wet etchants and wet etching process using the same.

Wet etching, a commonly-used fabrication process for making semiconductor device, is a material removal process that uses liquid chemicals (wet etchants) to remove materials from a wafer. A wet etching process involves multiple chemical reactions that consume the original reactants and produce new reactants.

One important consideration in wet etching process is the selectivity of the etchant. An etchant not only attacks the material being removed, but other materials (e.g., mask and substrate) exposed to the etchant as well. The selectivity of an etchant refers to its ability to remove only the material intended for etching, while leaving other materials intact. Thus, an ideal etchant needs to have a high selectivity, i.e., its etch rate for the material being etched must be much higher than its etch rates for other exposed materials.

SUMMARY

Embodiments of compositions of a wet etchant and additive thereto for selectively etching silicon nitride to silicon oxide are disclosed herein.

In an example, a composition of an additive to a phosphoric acid etchant includes an inhibitor and a dispersant. The inhibitor is absorbable on a surface of silicon oxide and capable of inhibiting etching of the surface of silicon oxide by the phosphoric acid etchant. The dispersant is capable of reacting with a by-product of a reaction between the phosphoric acid etchant and at least one of silicon oxide and silicon nitride and reducing a viscosity of the phosphoric acid etchant.

In another example, a composition of a wet etchant for selectively etching silicon nitride to silicon oxide includes phosphoric acid, a first organosilane having the general formula $SiR_3$—N, a surfactant, and a second organosilane having the general formula $SiR_3$—Cl.

In still another example, a method for selectively etching silicon nitride to silicon oxide is disclosed. A plurality layers of silicon nitride and a plurality layers of silicon oxide are alternatingly deposited. An opening is etched through the plurality layers of silicon nitride and the plurality layers of silicon oxide. An additive is added to a wet etchant including phosphoric acid. The additive includes a first organosilane having the general formula $SiR_3$—N and a weight concentration greater than about 0.3%, a surfactant having a weight concentration of about 0.03%, and a second organosilane having the general formula $SiR_3$—Cl and a weight concentration greater than about 4%. The etchant with the additive is applied to the plurality layers of silicon nitride and the plurality layers of silicon oxide through the opening.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
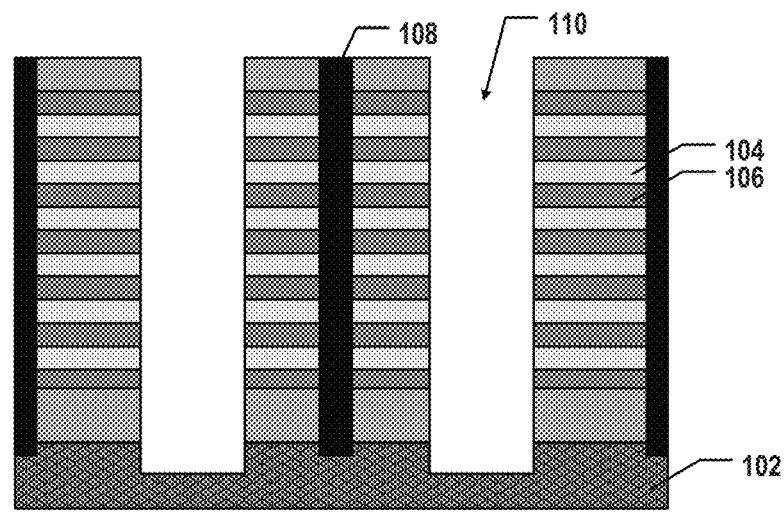
FIGS. 1A-1C illustrate an exemplary fabrication process for forming a 3D memory device, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

Figure 1B:
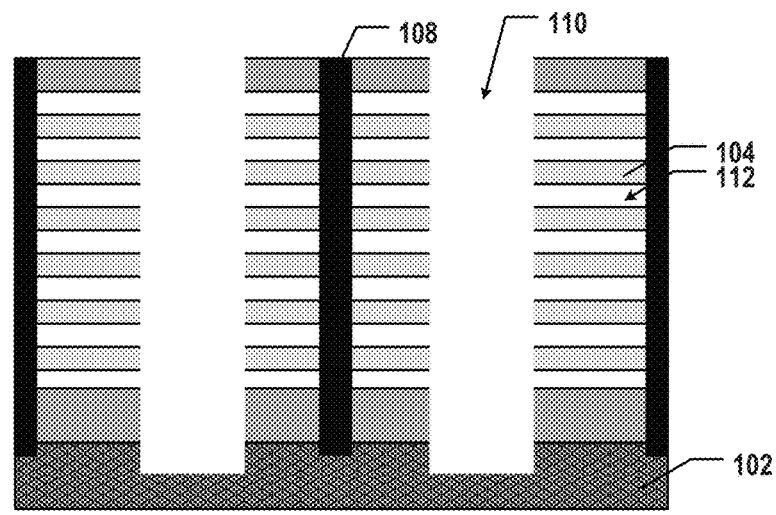
Figure 1C:
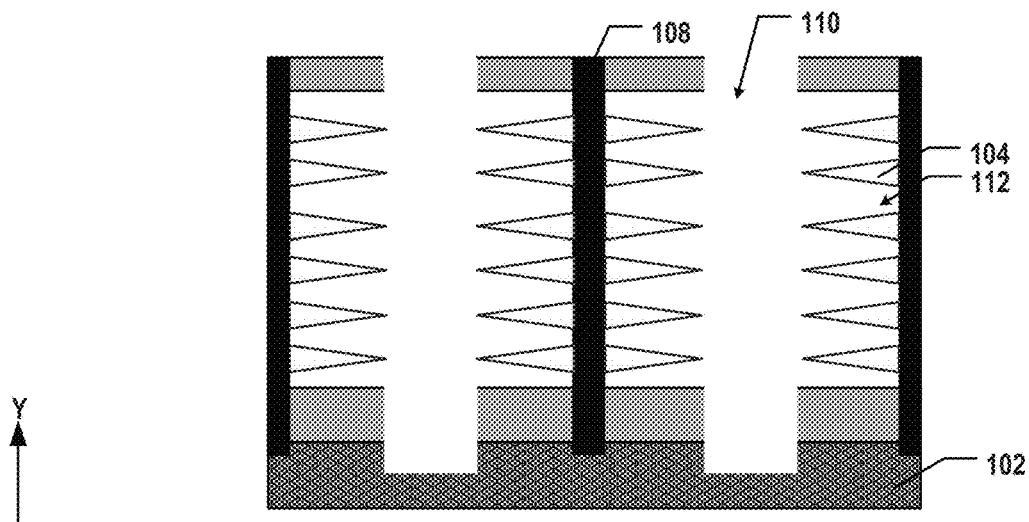

In fabricating some semiconductor devices, selective etching of silicon nitride to silicon oxide is needed for certain processes, such as the gate replacement process for making some 3D memory devices. FIGS. 1A-1C illustrate an exemplary fabrication process for forming a 3D memory device, according to some embodiments of the present disclosure. As illustrated in FIG. 1A, interleaved layers of silicon oxide 104 and layers of silicon nitride 106 are formed on a substrate 102, according to some embodiments. Substrate 102 can include silicon (e.g., single crystalline silicon), silicon germanium (SiGe), gallium arsenide (GaAs), germanium (Ge), silicon on insulator (SOI, germanium on insulator (GOI), or any other suitable materials. In some embodiments, substrate 102 is a thinned substrate (e.g., a semiconductor layer), which was thinned by grinding, etching, chemical mechanical polishing (CMP), or any combination thereof. Layers of silicon oxide 104 and layers of silicon nitride 106 can be alternatingly deposited on substrate 102 using one or more thin film deposition processes including, but not limited to, chemical vapor deposition (CVD), physical vapor deposition (PVD), atomic layer deposition (ALD), or any combination thereof.

It is noted that x and y axes are included in FIGS. 1A-1C to further illustrate the spatial relationship of the components in the 3D memory device. Substrate 102 of the 3D memory device includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a 3D memory device is determined relative to the substrate of the 3D memory device (e.g., substrate 102) in the y-direction (i.e., the vertical direction) when the substrate is positioned in the lowest plane of the 3D memory device in the y-direction. The same notion for describing spatial relationship is applied throughout the present disclosure.

The 3D memory device in FIGS. 1A-1C can be a NAND Flash memory device in which memory cells are provided in the form of an array of NAND memory strings 108 each extending vertically through layers of silicon oxide 104 and layers of silicon nitride 106. NAND memory strings 108 can include a channel hole filled with semiconductor materials (e.g., as a semiconductor channel) and dielectric materials (e.g., as a memory film). In some embodiments, the semiconductor channel (not shown) includes silicon, such as amorphous silicon, polysilicon, or single crystalline silicon. In some embodiments, the memory film (not shown) is a composite dielectric layer including a tunneling layer, a storage layer (also known as a "charge trap layer"), and a blocking layer. The remaining space of the channel hole can be partially or fully filled with a filling layer including dielectric materials, such as silicon oxide. NAND memory string 108 can have a cylinder shape (e.g., a pillar shape). The filling layer, semiconductor channel, tunneling layer, storage layer, and blocking layer are arranged radially from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, the memory film can include a composite dielectric layer of silicon oxide/silicon oxynitride (or silicon nitride)/silicon oxide (ONO).

As illustrated in FIG. 1A, openings 110 (e.g., slit openings) are etched through layers of silicon oxide 104 and layers of silicon nitride 106 using wet etching and/or dry etching processes, according to some embodiments. In some embodiments, the top portion of substrate 102 is etched as well, such that openings 110 extend into substrate 102. Openings 110 can be used as the pathways for the subsequent gate replacement process, which replaces layers of silicon nitride 106 (also known as "sacrificial layers") with conductive layers, such as layers of tungsten, which act as the gate lines and word lines of the memory cells of NAND memory strings 108. Layers of silicon oxide 104, however, remain in the 3D memory device after the gate replacement process.

As the first step of the gate replacement process, layers of silicon nitride 106 are selectively etched away to layers of silicon oxide 104 by applying a wet etchant through openings 110, resulting in lateral recesses 112 formed between layers of silicon oxide 104, according to some embodiments as illustrated in FIG. 1B or 1C. A wet etchant having heated phosphoric acid ($H_3PO_4$, phosphoric acid etchant) is used to selectively etch silicon nitride ($Si_3N_4$) to silicon oxide ($SiO_2$). The etch rates of the phosphoric acid etchant at about 150° C. to about 170° C. are about 35 angstrom per minute (A/min) to about 65 A/min for silicon nitride and about 70 angstrom per hour (A/h) to about 130 A/h for silicon oxide. In other words, the selectivity of the phosphoric acid etchant is about 30 between silicon nitride and silicon oxide. However, this selectivity is not high enough to prevent over-etching of layers of silicon oxide 104, which can result in undesired profiles of layers of silicon oxide 104 and later recesses 112, as illustrated in FIG. 1C.

In order to avoid over-etching of layers of silicon oxide 104 and achieve the desired profiles of layers of silicon oxide 104 and later recesses 112 (e.g., as illustrated in FIG. 1B), which are necessary for later depositing the conductive layer materials (e.g., tungsten) into lateral recesses 112, the selectivity of the phosphoric acid etchant between silicon nitride and silicon oxide needs to be increased to, for example, above 400, according to some embodiments. The mechanism of etching silicon nitride and silicon oxide using phosphoric acid etchant includes:

$$Si_3N_4 + H_3PO_4 + H_2O \rightarrow Si(OH)_4 + (NH_4)_3PO_4 \quad (1),$$

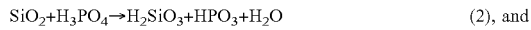
$$SiO_2 + H_3PO_4 \rightarrow H_2SiO_3 + HPO_3 + H_2O \quad (2), \text{ and}$$

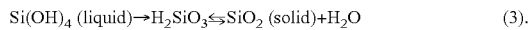
$$Si(OH)_4 \text{ (liquid)} \rightarrow H_2SiO_3 \leftrightarrows SiO_2 \text{ (solid)} + H_2O \quad (3).$$

As shown in Reaction (1), orthosilicic acid ($Si(OH)_4$) is a by-product of the reaction between silicon nitride and phosphoric acid, which is in a liquid phase and can become silicon oxide in a solid phase from a dehydration reaction as shown in Reaction (3). As shown in Reaction (2), metasilicic acid ($H_2SiO_3$) is a by-product of the reaction between silicon oxide and phosphoric acid. The etch rate of silicon oxide by the phosphoric acid etchant can be reduced by increasing the concentration of orthosilicic acid in the etchant solution, which in turn increases the selectivity between silicon nitride and silicon oxide. Moreover, the selectivity between silicon nitride and silicon oxide can be increased by reducing the temperature of the reactions, which impacts the etch rate of silicon oxide to a greater extent than that of silicon nitride.

Figure 2:
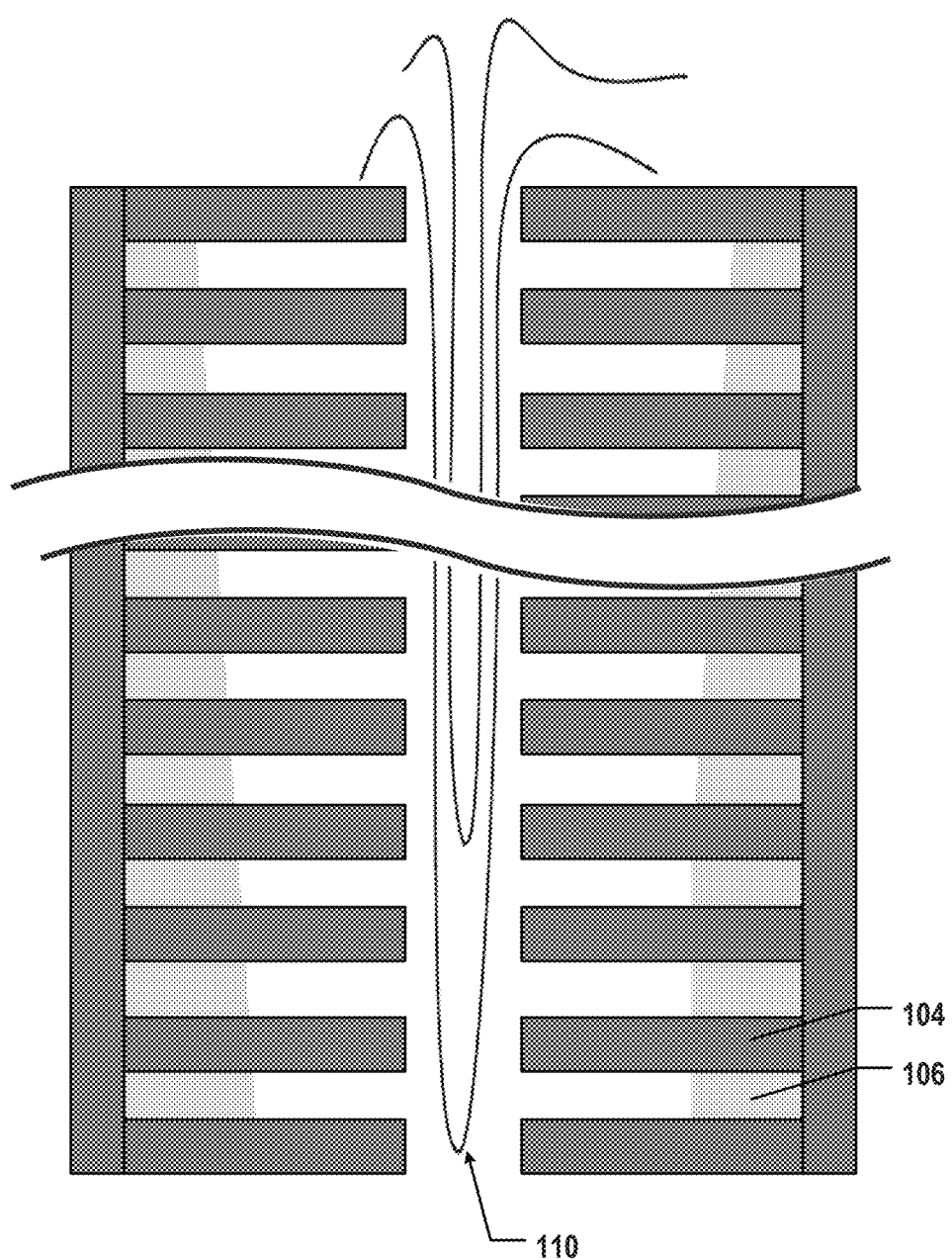
FIG. 2 illustrates chemical flows of a wet etchant applied to interleaved layers of silicon nitride and silicon oxide through an opening, according to some embodiments of the present disclosure.

The above-mentioned approaches for increasing the selectivity between silicon nitride and silicon oxide, however, may not be very effective when the aspect ratio of openings 110 becomes relatively large, for example, for 3D memory devices having 64 levels or more (e.g., 64, 96, 128, 160, or 192 levels), because the high aspect ratio profile makes the exchange of etchant solution inside openings 110, in particular at its bottom portion, less effective for example as shown in FIG. 2. Increasing flow rate of the etchant solution (e.g., by stirring or nitrogen gas purging) is also limited in improving the exchange rate as the aspect ratio of openings 110 continues to increase. In addition to high aspect ratio, the higher density of openings 110 also reduces the exchange rate of the etchant solution. The lower exchange rate of the etchant solution can increase the concentration of orthosilicic acid at the bottom of openings 110 because the reaction by-products cannot effectively diffuse up in openings 110, which can quickly become silicon oxide by dehydration and be solidified on the structure surface at the bottom of openings 110 (also known as "sticking back"). The uneven formation of extra silicon oxide in the vertical direction in openings 110 due to "sticking back" can significantly affect the performance of the 3D memory devices.

Various embodiments in accordance with the present disclosure provide an additive to phosphoric acid etchant that can effectively increase the selectivity between silicon nitride and silicon oxide as well as the uniformity of etch rate at different depths of high aspect ratio openings. In some embodiments, the additive includes a dispersant that is capable of reacting with the reaction by-products and reducing the viscosity of the phosphoric acid etchant. As a result, the by-products including orthosilicic acid can be quickly exchanged from the high concentration regions to the low concentration regions to avoid the "sticking back" of solidified silicon oxide dehydrated from orthosilicic acid. In some embodiments, the additive further includes an inhibitor that is absorbable on silicon oxide surface and capable of uniformly inhibiting etching of silicon oxide by the phosphoric acid etchant. Accordingly, the etching of silicon oxide caused by the phosphoric acid etchant with the additive can become controllable, thereby increasing the yield of the selective etching process.

Figure 3:
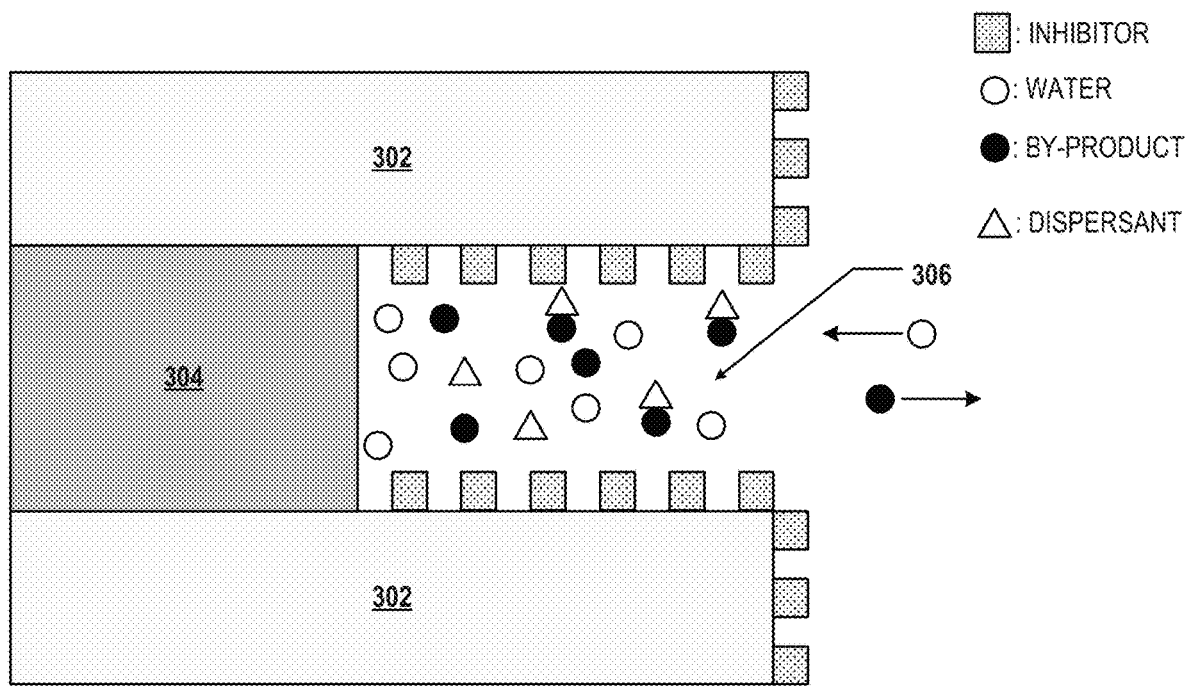
FIGS. 3-4 illustrate an exemplary mechanism of selectively etching silicon nitride to silicon oxide using a phosphoric acid etchant with an additive having an inhibitor and a dispersant, according to some embodiments of the present disclosure.
Figure 4:
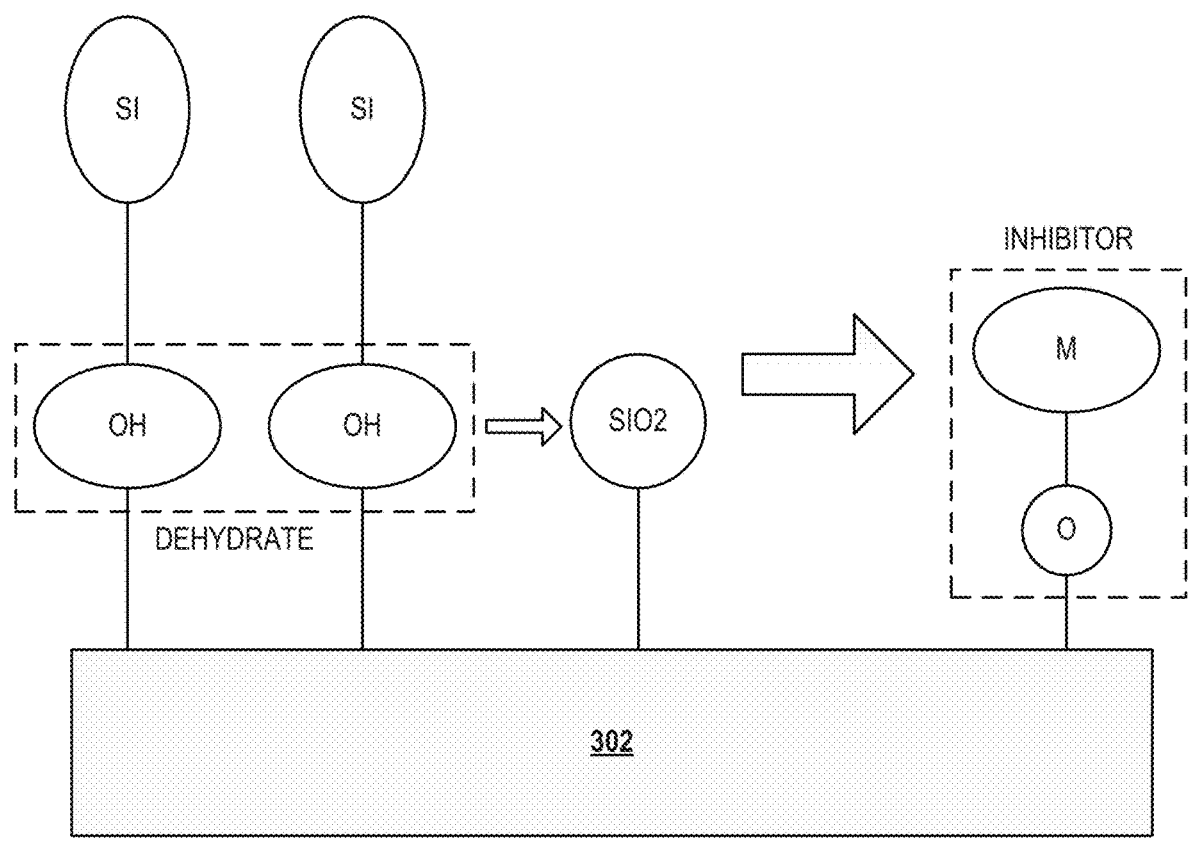

FIGS. 3-4 illustrate an exemplary mechanism of selectively etching silicon nitride to silicon oxide using a phosphoric acid etchant with an additive having an inhibitor and a dispersant, according to some embodiments of the present disclosure. In some embodiments, the composition of an additive to a phosphoric acid etchant includes an inhibitor and a dispersant. The inhibitor is absorbable on the surface of silicon oxide 302 and capable of inhibiting etching of the surface of silicon oxide 302 by the phosphoric acid etchant, according to some embodiments. The adsorptive inhibitor can prevent the contact of phosphoric acid with silicon oxide 302 by forming a uniform protective layer on the surface of silicon oxide 302, such that silicon oxide 302 can only be slightly and uniformly etched by phosphoric acid.

Figure 5:
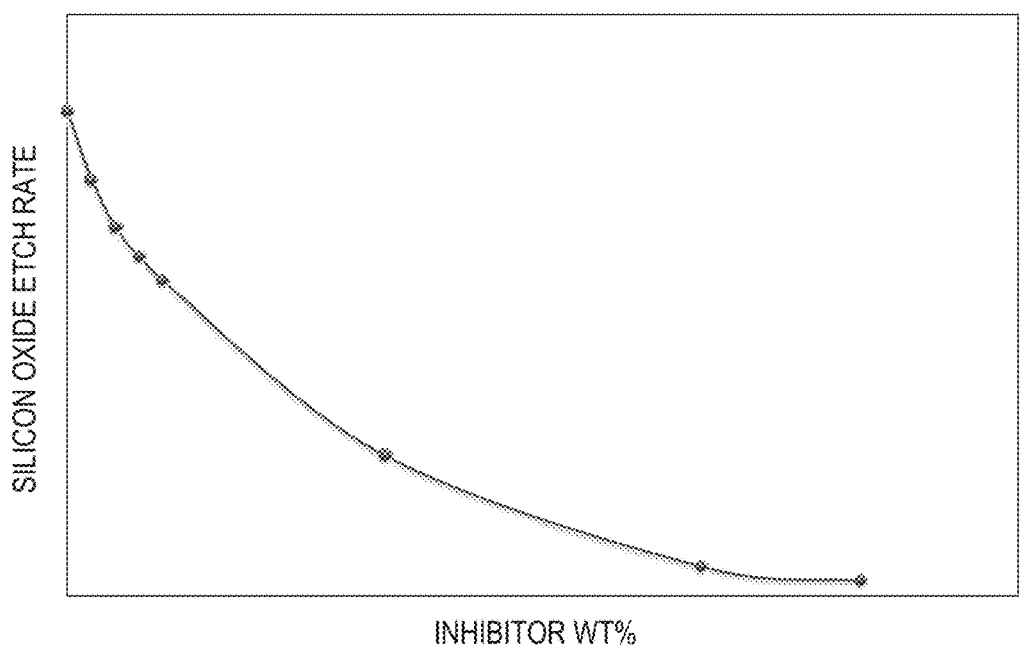
FIG. 5 illustrates exemplary results of the impact of the weight concentration of inhibitor on the etch rate of silicon oxide, according to some embodiments of the present disclosure.

In some embodiments, the inhibitor includes an organosilane. The organosilanes are a group of chemical compounds derived from silanes containing one or more organic groups. The organosilane of the inhibitor is capable of reacting with phosphoric acid to form organosilane phosphate as a protective layer on the surface of silicon oxide 302 to isolate the undesired by-products of the reaction between phosphoric acid and silicon nitride 304, such as orthosilicic acid. FIG. 5 illustrates exemplary results of the impact of the weight concentration of inhibitor (e.g., organosilane inhibitor) on the etch rate of silicon oxide 302, according to some embodiments of the present disclosure. As illustrated in FIG. 5, the etch rate of silicon oxide 302 decreases as the weight concentration of the organosilane in the phosphoric acid etchant (with the additive) increases. As a result, by increasing the weight concentration of the organosilane inhibitor in the phosphoric acid etchant, the selectivity between silicon nitride 304 and silicon oxide 302 can be increased.

In some embodiments, the weight concentration of the organosilane of the inhibitor is greater than about 3%, such as greater than 3%. In some embodiments, the weight concentration of the organosilane is greater than about 4%, such as greater than 4%. In some embodiments, the weight concentration of the organosilane is between about 4% and about 10%, such as between 4% and 10% (e.g., 4%, 4.5%, 5%, 5.5%, 6%, 6.5%, 7%, 7.5%, 8%, 8.5%, 9%, 9.5%, 10%, any range bounded by the lower end by any of these values, or any range defined by any two of these values). In some embodiments, the weight concentration of the organosilane is between about 4% and about 5%, such as between 4% and 5% (e.g., 4%, 4.1%, 4.2%, 4.3%, 4.4%, 4.5%, 4.6%, 4.7%, 4.8%, 4.9%, 5%, any range bounded by the lower end by any of these values, or any range defined by any two of these values). In some embodiments, the etch rate of silicon oxide 302 is below about 10 A/h when the weight concentration of the organosilane is above about 4%. In some embodiments, the etch rate of silicon oxide 302 is below about 5 A/h when the weight concentration of the organosilane is above about 5%.

In some embodiments, the organosilane is an organochlorosilane having the general formula $SiR_3$—Cl. The organochlorosilanes are a group of organic derivatives of chlorosilanes, where one or more hydrogens have (formally) been replaced by organic groups. R can be any suitable functional groups bonded to a silicon atom in the organochlorosilane inhibitor by covalent bonds. R is a methyl group, a vinyl group, an alkyl group, a phenyl group, an ethyl group, or a propyl group, according to some embodiments. In some embodiments, one end of the organochlorosilane inhibitor (e.g., one of its functional groups) is bonded to the surface of silicon oxide 302, for example as shown in FIG. 5 in which an oxygen atom of a functional group of the organochlorosilane inhibitor is bonded to the surface of silicon oxide 302. In the organosilane inhibitor, a silicon atom can be bonded to three functional groups and a chlorine atom. As it can be appreciated by those skilled in the art, chlorine is more electronegative than silicon. In some embodiments, the Si—Cl bond in the organochlorosilane inhibitor can be polar covalent, for example, having a negative charge. The negative charge of the chlorine atom on another end of the organochlorosilane inhibitor can further inhibit the etching of silicon oxide 302 by phosphoric acid, thereby further increasing the selectivity between silicon nitride 304 and silicon oxide 302.

The dispersant of the additive is capable of reacting with the by-products of the reaction between the phosphoric acid etchant and at least one of silicon oxide 302 and silicon nitride 304, according to some embodiments. In some embodiments, the dispersant is further capable of reducing the viscosity of the phosphoric acid etchant. The wet etching process can include three basic steps: (I) diffusion of the liquid etchant to the structure that is to be removed; (II) reaction between the liquid etchant and the material being etched away (e.g., Reactions (1) and (2) above); and (III) diffusion of the by-products in the reaction from the reacted surface. As shown in FIGS. 3-4, the dispersant of the additive can react with the by-products of the reaction between the phosphoric acid etchant and silicon oxide 302 (e.g., metasilicic acid as shown in Reaction (2) above) and/or the by-products of the reaction between the phosphoric acid etchant and silicon nitride 304 (e.g., orthosilicic acid as shown in Reaction (1) above) and facilitate the diffusion of the by-products from the reacted surface, for example from lateral recesses 306 to the top of the openings, thereby avoiding orthosilicic acid to be solidified by the dehydration reaction and stick up to the reacted surface in the form of silicon oxide. That is, the dispersant can lift off solidified orthosilicic acid by-products from the surface of silicon oxide 302 to prevent regrowth of silicon oxide.

In some embodiments, the dispersant includes an organosilane. The organosilanes are a group of chemical compounds derived from silanes containing one or more organic groups. In some embodiments, the weight concentration of the organosilane of the dispersant in the phosphoric acid etchant with the additive is greater than about 0.2%, such as greater than 0.2%. In some embodiments, the weight concentration of the organosilane is greater than about 0.3%, such as greater than 0.3%. In some embodiments, the weight concentration of the organosilane is between about 0.3% and about 1%, such as between 0.3% and 1% (e.g., 0.3%, 0.35%, 0.4%, 0.45%, 0.5%, 0.55%, 0.6%, 0.65%, 0.7%, 0.75%, 0.8%, 0.85%, 0.9%, 0.95%, 1%, any range bounded by the lower end by any of these values, or any range defined by any two of these values).

In some embodiments, the organosilane of the dispersant has the general formula $SiR_3$—N. R can be any suitable functional groups bonded to a silicon atom in the organosilane by covalent bonds. R is a methyl group, a vinyl group, an alkyl group, a phenyl group, an ethyl group, or a propyl group, according to some embodiments. In some embodiments, one end of the organosilane of the dispersant (e.g., one of its functional groups) is bonded to the surface of silicon oxide 302. In the organosilane of the dispersant, a silicon atom can be bonded to three functional groups and a nitrogen atom having a positive charge. The positive charge of the nitrogen atom on another end of the organosilane of the dispersant is capable of reacting with and dispersing the reaction by-products, such as orthosilicic acid and metasilicic acid, to inhibit the regrowth of silicon oxide.

In some embodiments, the dispersant further includes a surfactant. Surfactants are compounds that lower the surface tension (or interfacial tension) between two liquids, between a gas and a liquid, or between a liquid and a solid. Surfactants are usually organic compounds that are amphiphilic, i.e., containing both hydrophobic groups and hydrophilic groups. In the bulk aqueous phase, surfactants can form aggregates, such as micelles, where the hydrophobic groups form the core of the aggregate and the hydrophilic groups are in contact with the surrounding liquid. Other types of aggregates can also be formed, such as spherical or cylindrical micelles or lipid bilayers. In some embodiments, the surfactant in the dispersant is capable of reducing the viscosity of the phosphoric acid etchant, thereby facilitating the chemical exchange, in particular at the bottom of the structure.

Figure 6:
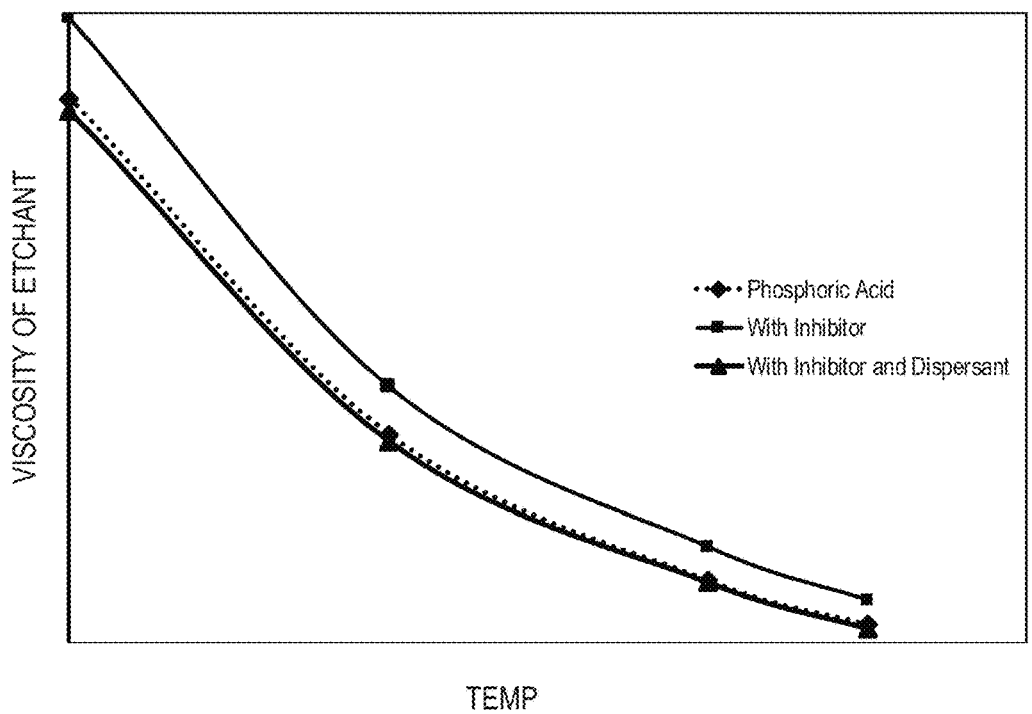
FIG. 6 illustrates exemplary results of the impact of the temperature and the additions of inhibitor and dispersant on the viscosity of the etchant, according to some embodiments of the present disclosure.

FIG. 6 illustrates exemplary results of the impact of the temperature and the additions of inhibitor and dispersant on the viscosity of the etchant, according to some embodiments of the present disclosure. As illustrated in FIG. 6, the addition of the inhibitor (e.g., organochlorosilane) increases the viscosity of the phosphoric acid etchant, while the further addition of the dispersant (e.g., including surfactant) reduces the viscosity of the phosphoric acid etchant to be close to the viscosity of phosphoric acid without the inhibitor. The dispersant is capable of reducing the viscosity of the phosphoric acid etchant to no greater than the viscosity of phosphoric acid at the same temperature, according to some embodiments. That is, the dispersant can effectively compensate for the viscosity increase caused by the inhibitor added into the phosphoric acid etchant. In some embodiments, the viscosity of the phosphoric acid etchant with the dispersant is not greater than about 45 mPa·s at 20° C., such as not greater than 45 mPa·s at 20° C. In some embodiments, the viscosity of the phosphoric acid etchant with the dispersant is between about 44 mPa·s and about 45 mPa·s at 20° C., such as between 44 mPa·s and 45 mPa·s at 20° C. (e.g., 44 mPa·s, 44.1 mPa·s, 44.2 mPa·s, 44.3 mPa·s, 44.4 mPa·s, 44.5 mPa·s, 44.6 mPa·s, 44.7 mPa·s, 44.8 mPa·s, 44.9 mPa·s. 45 mPa·s, any range bounded by the lower end by any of these values, or any range defined by any two of these values). As further shown in FIG. 6, the viscosity of the phosphoric acid etchant (with or without the inhibitor and dispersant) decreases as the temperature increases. In some embodiments, the viscosity of the phosphoric acid etchant with the dispersant is not greater than about 38 mPa·s at 25° C., such as not greater than 38 mPa·s at 25° C. The viscosities described above are measured according to ASTM D445—Standard Test Method for Kinematic Viscosity of Transparent and Opaque Liquids.

In some embodiments, the weight concentration of the surfactant of the dispersant in the phosphoric acid etchant is greater than about 0.02%, such as greater than 0.02%. In some embodiments, the weight concentration of the surfactant is between about 0.02% and about 0.04%, such as between 0.02% and 0.04% (e.g., 0.02%, 0.025%, 0.03%, 0.035%, 0.04%, any range bounded by the lower end by any of these values, or any range defined by any two of these values). In some embodiments, the weight concentration of the surfactant is about 0.03%, such as 0.03%.

In some embodiments, a composition of a wet etchant for selectively etching silicon nitride 304 to silicon oxide 302 includes phosphoric acid, a first organosilane having the general formula $SiR_3$—N, a surfactant, and a second organosilane having the general formula $SiR_3$—Cl. In some embodiments, the weight concentration of the first organosilane is greater than about 0.2%, such as greater than about 0.3%. In some embodiments, the weight concentration of the surfactant is greater than about 0.02%, such as about 0.03%. In some embodiments, the weight concentration of the second organosilane is greater than about 3%, such as greater than about 4%. In some embodiments, R is a methyl group, a vinyl group, an alkyl group, a phenyl group, an ethyl group, or a propyl group. In some embodiments, the viscosity of the etchant is not greater than the viscosity of the phosphoric acid at the same temperature, such as not greater than about 45 mPa·s at 20° C.

Figure 7:
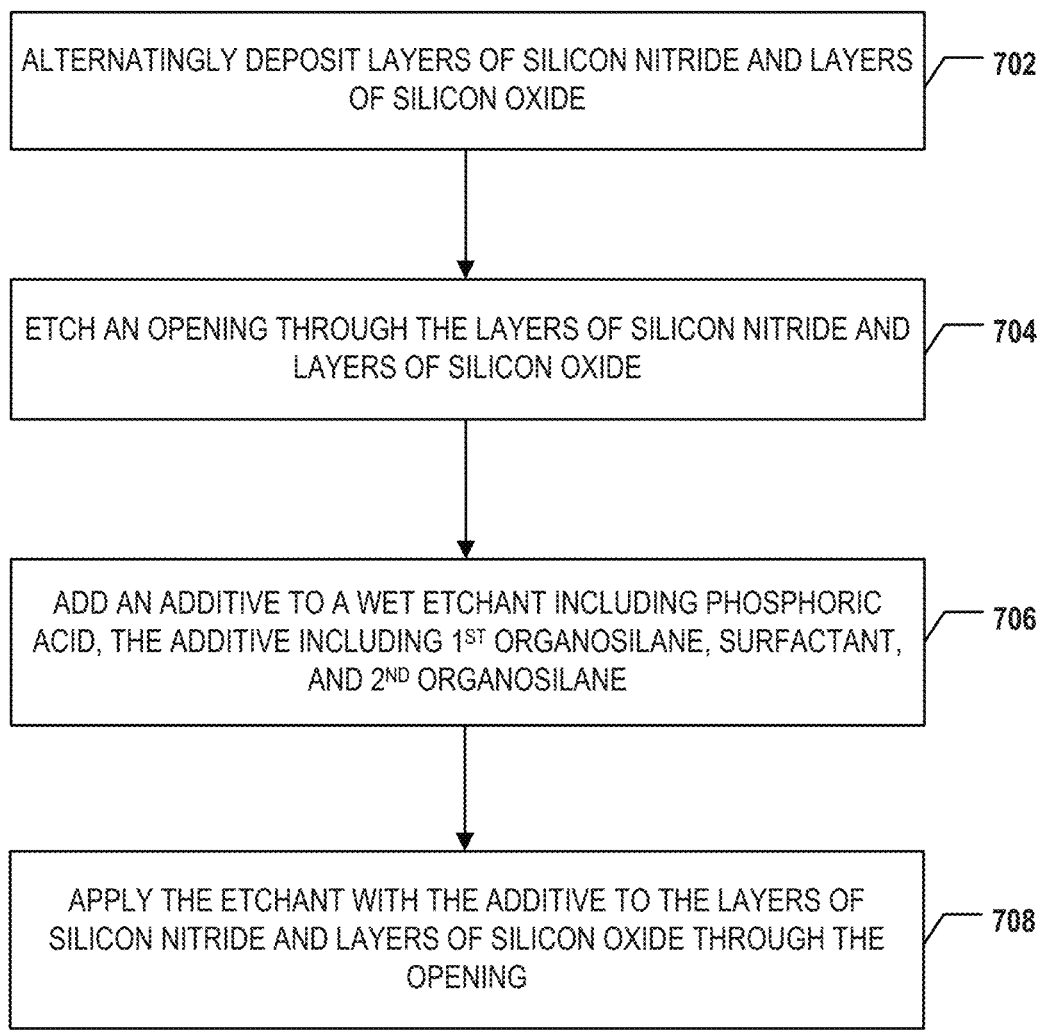
FIG. 7 illustrates a flowchart of an exemplary method for selectively etching silicon nitride to silicon oxide, according to some embodiments of the present disclosure.

FIG. 7 illustrates a flowchart of an exemplary method 700 for selectively etching silicon nitride to silicon oxide, according to some embodiments of the present disclosure. FIGS. 1A-1B and 7 will be described together. It is understood that the operations shown in method 700 are not exhaustive and that other operations can be performed as well before, after, or between any of the illustrated operations. Further, some of the operations may be performed simultaneously, or in a different order than shown in FIG. 7.

Referring to FIG. 7, method 700 starts at operation 702, in which layers of silicon nitride and layers of silicon oxide are alternatingly deposited. Referring to FIG. 1A, interleaved layers of silicon oxide 104 and layers of silicon nitride 106 are formed on substrate 102 using one or more thin film deposition processes including, but not limited to, CVD, PVD, ALD, or any combination thereof.

Method 700 proceeds to operation 704, as illustrated in FIG. 7, in which an opening is etched through the layers of silicon nitride and the layers of silicon oxide. As illustrated in FIG. 1A, openings 110 are etched through interleaved layers of silicon oxide 104 and layers of silicon nitride 106 using wet etching and/or dry etching processes, such as deep reactive-ion etch (DRIE).

Method 700 proceeds to operation 706, as illustrated in FIG. 7, in which an additive is added to a wet etchant including phosphoric acid. The additive includes a first organosilane having the general formula $SiR_3$—N and weight concentration greater than about 0.3%, a surfactant having weight concentration of about 0.03%, and a second organosilane having the general formula $SiR_3$—Cl and weight concentration greater than about 4%. In some embodiments, R is a methyl group, a vinyl group, an alkyl group, a phenyl group, an ethyl group, or a propyl group. In some embodiments, the viscosity of the etchant with the additive is not greater than the viscosity of the phosphoric acid at the same temperature. In some embodiments, the viscosity of the etchant is not greater than about 45 mPa·s at 20° C.

Method 700 proceeds to operation 708, as illustrated in FIG. 7, in which the etchant with the additive is applied to the layers of silicon nitride and the layers of silicon oxide through the openings. As illustrated in FIG. 1B, the etchant with the additive is applied to interleaved layers of silicon oxide 104 and layers of silicon nitride 106 through openings 110 to selectively etch layers of silicon nitride 106 to layers of silicon oxide 104, resulting in lateral recesses 112. Compared with the example of FIG. 1C due to over-etching of layers of silicon oxide 104, the etchant with the additive disclosed herein can improve the selectivity between silicon nitride and silicon oxide to prevent over-etching of layers of silicon oxide 104 as well as significantly improve the uniformity of etch rate of silicon oxide along the vertical direction of openings 110, thereby achieving desired profiles of lateral recesses 112 and layers of silicon oxide 104 as shown in FIG. 1B for later deposition of conductive layer materials into lateral recesses 112.

According to one aspect of the present disclosure, a composition of an additive to a phosphoric acid etchant includes an inhibitor and a dispersant. The inhibitor is absorbable on a surface of silicon oxide and capable of inhibiting etching of the surface of silicon oxide by the phosphoric acid etchant. The dispersant is capable of reacting with a by-product of a reaction between the phosphoric acid etchant and at least one of silicon oxide and silicon nitride and reducing a viscosity of the phosphoric acid etchant.

In some embodiments, the dispersant includes a first organosilane and a surfactant. In some embodiments, the first organosilane has the general formula $SiR_3$—N. R can be a methyl group, a vinyl group, an alkyl group, a phenyl group, an ethyl group, or a propyl group.

In some embodiments, a weight concentration of the first organosilane is greater than about 0.2%. The weight concentration of the first organosilane can be greater than about 0.3%. In some embodiments, a weight concentration of the surfactant is greater than about 0.02%. The weight concentration of the surfactant can be about 0.03%.

In some embodiments, the viscosity of the phosphoric acid etchant is reduced to no greater than a viscosity of phosphoric acid at a same temperature. In some embodiments, the viscosity of the phosphoric acid etchant is not greater than about 45 mPa·s at 20° C.

In some embodiments, the inhibitor includes a second organosilane. In some embodiments, the second organosilane includes an organochlorosilane having the general formula $SiR_3$—Cl. R can be a methyl group, a vinyl group, an alkyl group, a phenyl group, an ethyl group, or a propyl group.

In some embodiments, a weight concentration of the second organosilane is greater than about 3%. The weight concentration of the second organosilane can be greater than about 4%.

According to another aspect of the present disclosure, a composition of a wet etchant for selectively etching silicon nitride to silicon oxide includes phosphoric acid, a first organosilane having the general formula $SiR_3$—N, a surfactant, and a second organosilane having the general formula $SiR_3$—Cl.

In some embodiments, a weight concentration of the first organosilane is greater than about 0.2%. The weight concentration of the first organosilane can be greater than about 0.3%. In some embodiments, a weight concentration of the surfactant is greater than about 0.02%. The weight concentration of the surfactant can be about 0.03%. In some embodiments, a weight concentration of the second organosilane is greater than about 3%. The weight concentration of the second organosilane can be greater than about 4%.

In some embodiments, R is a methyl group, a vinyl group, an alkyl group, a phenyl group, an ethyl group, or a propyl group.

In some embodiments, a viscosity of the etchant is not greater than a viscosity of the phosphoric acid at a same temperature. In some embodiments, the viscosity of the etchant is not greater than about 45 mPa·s at 20° C.

According to still another aspect of the present disclosure, a method for selectively etching silicon nitride to silicon oxide is disclosed. A plurality layers of silicon nitride and a plurality layers of silicon oxide are alternatingly deposited. An opening is etched through the plurality layers of silicon nitride and the plurality layers of silicon oxide. An additive is added to a wet etchant including phosphoric acid. The additive includes a first organosilane having the general formula $SiR_3$—N and a weight concentration greater than about 0.3%, a surfactant having a weight concentration of about 0.03%, and a second organosilane having the general formula $SiR_3$—Cl and a weight concentration greater than about 4%. The etchant with the additive is applied to the plurality layers of silicon nitride and the plurality layers of silicon oxide through the opening.

In some embodiments, R is a methyl group, a vinyl group, an alkyl group, a phenyl group, an ethyl group, or a propyl group.

In some embodiments, a viscosity of the etchant with the additive is not greater than a viscosity of the phosphoric acid at a same temperature. In some embodiments, the viscosity of the etchant is not greater than about 45 mPa·s at 20° C.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A composition of an additive to a phosphoric acid etchant, comprising:
   an inhibitor, comprising a general formula $SiR_3$—Cl and a weight concentration greater than 4%, that is absorbable on a surface of silicon oxide and capable of inhibiting etching of the surface of silicon oxide by the phosphoric acid etchant; and
   a dispersant comprising a general formula $SiR_3$—N and capable of (i) reacting with a by-product of a reaction between the phosphoric acid etchant and at least one of silicon oxide or silicon nitride, and (ii) reducing a viscosity of the phosphoric acid etchant.

2. The composition of claim 1, wherein the dispersant further comprises a surfactant.

3. The composition of claim 2, wherein R is a methyl group, a vinyl group, an alkyl group, a phenyl group, an ethyl group, or a propyl group.

4. The composition of claim 2, The composition of claim 2, wherein the dispersant comprises an organosilane having the general formula $SiR_3$—N and a weight concentration greater than 0.2%.

5. The composition of claim 4, wherein the weight concentration of the organosilane is greater than 0.3%.

6. The composition of claim 2, wherein a weight concentration of the surfactant is greater than 0.02%.

7. The composition of claim 6, wherein the weight concentration of the surfactant is 0.03%.

8. The composition of claim 1, wherein the viscosity of the phosphoric acid etchant is not greater than a viscosity of phosphoric acid at a same temperature.

9. The composition of claim 8, wherein the viscosity of the phosphoric acid etchant is not greater than 45 mPa·s at 20° C.

10. The composition of claim 1, wherein the inhibitor comprises another organosilane having the general formula $SiR_3$—Cl.

11. The composition of claim 10, wherein the other organosilane comprises an organochlorosilane having the general formula $SiR_3$—Cl.

12. The composition of claim 11, wherein R is a methyl group, a vinyl group, an alkyl group, a phenyl group, an ethyl group, or a propyl group.

13. The composition of claim 10, wherein a weight concentration of the other organosilane is greater than 3%.

14. The composition of claim 1, wherein an etch rate of the phosphoric acid etchant on the silicon oxide is below 5 Å/h when the weight concentration of the inhibitor is above 5%.

15. A composition of a wet etchant for selectively etching silicon nitride to silicon oxide, comprising:
   phosphoric acid;
   a first organosilane having the general formula $SiR_3$—N and capable of reducing a viscosity of the wet etchant to be no greater than about 45 mPa·s at 20 degrees Celsius;
   a surfactant; and
   a second organosilane having the general formula $SiR_3$—Cl.

16. The composition of claim 15, wherein the weight concentration of the first organosilane is greater than 0.3%.

17. The composition of claim 15, wherein the weight concentration of the surfactant is 0.03%.

18. The composition of claim 15, wherein the weight concentration of the second organosilane is greater than 4%.

19. The composition of claim 15, wherein the weight concentration of the second organosilane is between 4% and 10%.

20. A method for selectively etching silicon nitride to silicon oxide, comprising:
   alternatingly depositing a plurality layers of silicon nitride and a plurality layers of silicon oxide;
   etching an opening through the plurality layers of silicon nitride and the plurality layers of silicon oxide;
   adding an additive to a wet etchant comprising phosphoric acid, wherein the additive comprises a first organosilane having the general formula $SiR_3$—N and a weight concentration greater than 0.3%, a surfactant having a weight concentration of 0.03%, and a second organosilane having the general formula $SiR_3$—Cl and a weight concentration greater than 4%; and
   applying the etchant with the additive to the plurality layers of silicon nitride and the plurality layers of silicon oxide through the opening.

* * * * *